United States Patent [19]

Jaffer

[11] Patent Number: 4,727,596

[45] Date of Patent: Feb. 23, 1988

[54] HIGH DYNAMIC RANGE MIXER

[76] Inventor: Aubrey Jaffer, 84 Pleasant St., Wakefield, Mass. 01880

[21] Appl. No.: 886,632

[22] Filed: Jul. 16, 1986

[51] Int. Cl.[4] .............................................. H04B 1/26
[52] U.S. Cl. .................................. 455/326; 455/332; 455/333; 332/43 B
[58] Field of Search ................ 455/326, 332, 333; 332/43 B; 333/4, 5, 25

[56] References Cited

U.S. PATENT DOCUMENTS

| | | | |
|---|---|---|---|
| 3,355,678 | 11/1967 | Echarti | 332/43 B |
| 3,636,478 | 1/1972 | Glock | 332/43 B |
| 3,829,797 | 8/1974 | Karkar et al. | 332/43 B |
| 3,925,736 | 12/1975 | Lohrmann | 332/43 B |
| 4,367,560 | 1/1983 | Hallford | 455/332 |

OTHER PUBLICATIONS

Mixers for High Performance Radio, Professional Program Session Record 24, Wescon 81, Electronic Show & Convention, Sep. 15-17, 1981, Brooks Hall & Civic Auditorium, Hilton, Hotel San Francisco, CA, Program, pp. 1-4.
Symmetric MOSFET Mixers of High Dynamic Range, R. P. Rafuse, Session XI, Circuit Techniques II, 1968 International Solid-State Circuits Conference, pp. 122 & 123.
Modeling and Simulation of Insulated-Gate Field-Effect Transistor Switching Circuits, H. Schichman and D. A. Hodges, IEEE J. Solid-State Circuits, vol. SC-3, Sep. 1968, pp. 285-289.
Termination Insensitive Mixers, Peter Will, Adams Russel, Anzac Division, one page.

Primary Examiner—Michael A. Masinick
Attorney, Agent, or Firm—Weingarten, Schurgin, Gagnebin & Hayes

[57] ABSTRACT

A high performance, double-balanced mixer comprising a novel transformer and a pair of variable conductance semiconductor devices connected thereto which provides an output signal being the product of two input signals. Two transformer windings each include a center tap which together form one port of the mixer. Each variable conductance devices provides a selected conductivity path across the end of one of the center tapped windings to the beginning of the other center tapped winding. A second port signal provided oppositely modulates the variable conductance devices to provide a decrease in conductivity across one path while increasing the conductivity of the other path. The third winding of the transformer provides a third port to the mixer. A singularly-balanced mixer embodiment is shown. The mixer according to the present invention is operable to provide vastly improved linearity for either of two inputs as well as low noise and wide bandwidth operation.

14 Claims, 11 Drawing Figures

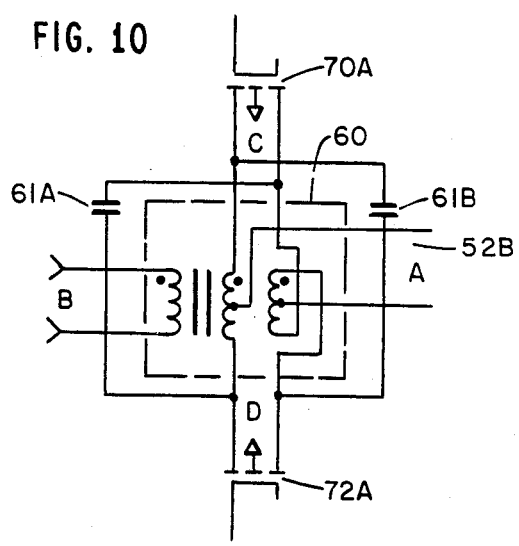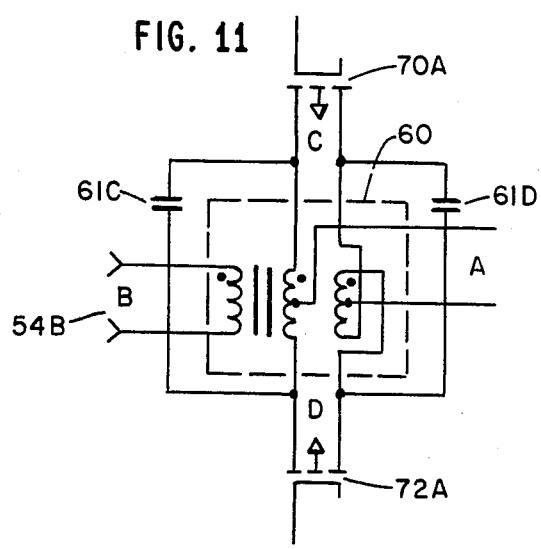

HIGH DYNAMIC RANGE MIXER

FIELD OF THE INVENTION

The present invention relates to balanced mixers and, in particular, to doubly-balanced mixers having wide dynamic range and low distortion products for use in radio frequency circuits.

BACKGROUND OF THE INVENTION

Mixer performance is measured according to the bandwidth, noise characteristic, as well as dynamic range. The dynamic range is limited by noise and distortion products. An indicative measurement is the intermodulation intercept point or other similar criteria. Mixer and mixer designs have been based either on switching or small signal approximations to the modulating function. Due to the high harmonic content of switching and nonlinearities of the large signal functions, these mixers have been plagued by harmonic mixing, spurious responses, and intermodulation distortion. Furthermore, optimum mixer performance generally requires a constant 50 ohm nominal impedance across all ports. Commercially available high performance diode ring double-balanced mixers have a third order of input intermodulation intercept point of +35 dBm.

High frequency mixer and mixer applications which require doubly-balanced performance typically use the well-known diode ring type mixer or a variation thereof, which include active devices and transformers. The equipment, which includes mixers, is directly limited by the performance of the mixers. It is therefore desirable to improve equipment performance by improving the performance of double-balanced mixers while maintaining wide bandwidth characteristics and their simplicity and economy.

SUMMARY OF THE PRESENT INVENTION

The present invention comprises a high performance, doubly-balanced mixer, providing vastly improved linearity for both inputs, low noise and wide bandwidth operation, and includes a novel three winding transformer. Two variably conductive elements each provide a selectively oppositely variable conductance path across the beginning of one end of one of two windings and the end of the other of the two windings. The two windings so connected further each comprise a center tap which together provide a signal port. Another port is provided by the third winding of the transformer. Either of the first two ports can receive an input while the other port provides the mixer output. A signal input port controls the oppositely variable conductance paths.

The mixer according to the present invention provides a high third order input intermodulation point, typically +40dBm for both inputs, greater than that previously commercially available. Furthermore, the increased performance is achieved without the requirement of the constant 50 ohm impedance at all ports. Moreover, the resulting product is inexpensive, easily and economically manufactured, while maintaining enhanced performance over the mixers and mixers available previously.

BRIEF DESCRIPTION OF THE DRAWING

These and other features according to the present invention will be better understood by reading the following detailed description, taken together with the drawing wherein:

FIG. 10 is a schematic diagram of an improved embodiment of the present invention having enhanced termination of the center tap port;

FIG. 11 is a schematic diagram showing an enhanced termination of the port having an isolated winding.

DETAILED DESCRIPTION OF THE PRESENT INVENTION

Figure 1:
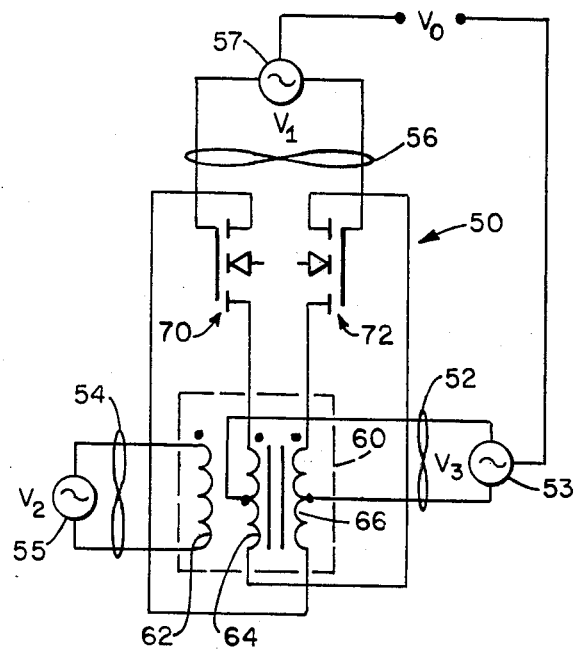
FIG. 1 is a schematic diagram of the doubly-balanced mixer according to one embodiment of the present invention.

A schematic diagram 50 of FIG. 1 showing one embodiment of the doubly-balanced mixer according to the present invention, comprises a transformer 60 having three windings 62, 64 and 66, shown having the beginning end indicated by a dot. Windings 64 and 66 are provided with center taps, which together form a port and across which a balanced signal input or output may be connected at 52. The beginning of winding 64 is connected to the end of winding 66 through a variable conductance element; similarly, the beginning of winding 66 connected to the end of winding 64 through a second variable conductance element. In the embodiment shown in FIG. 1, these variable conductance elements comprise field effect transistors (FETs) 70 and 72, respectively. In the same manner that the center tap of winding 64 and 66 form one port of the mixer, another port at 56 receives a balanced signal source 57, and a port 54 is connected to the third winding 62.

The port at 56 can only serve as a signal input port as it serves to excite or control the variable conductance elements, FETs 70 and 72, respectively. Since the FETs 70 and 72 typically require bias potential for conduction through all levels of the signal imposed thereon, a bias potential is necessarily developed thereacross. The bias voltage $V_0$ is applied across the center of the exciting source 57 and the source or output at 52. The bias potential may be selected according to the operating characteristics of the field effect transistors 70 and 72, to maintain them in a selected conductivity range throughout the modulation of signal source 56 and may be used to select or control the impedance of the mixer 50. Since the present invention provides a constant total conductivity for both FETs 70 and 72, the impedance of the mixer is controlled by the conductivity of the FETs 70 and 72, and thus the bias (e.g., by adjusting 110 of FIG. 4). The third winding 62 is connected to a signal source or provides an output 55 at 54.

Therefore, according to the present invention, a signal may be received from the doubly-balanced mixer 50 according to the present invention at either port 54 or 52 by providing a signal output at 54 or 52, the remaining two ports serving to receive a source signal. For optimum operation, it is preferable that either port 52 or 54 be deliberately mismatched and terminated in a low impedance.

In operation, if the circuit 50 is provided with a low impedance at 52 or 54, when the first FET is made more conductive and eventually providing a maximally conductive path between the beginning of winding 64 to the end of winding 66, the signal imposed from source 55 is received at 52 and 53 according to a first phase. When the second FET 72 is made more conductive, the first FET 70 is simultaneously made less conductive, to provide the conductive path between the end of winding 64 and the beginning of winding 66, wherein the signal received at 52 and 53 from the signal imposed at 54 is received in opposite phase of polarity to that previously provided when transistor 70 was made conductive. In periods when the signal at 56 causes transistors 70 and 72 to be equally conductive, the resulting signal imposed in the transformer 60 at 54 is balanced out by two partially conductive paths connected to either opposite ends of windings 64 and 66.

According to a MOSFET four terminal equation (Appendix), when all voltages are referenced to a midpoint between source and drain, and the gates biased "on" and driven differentially, one can achieve perfect multiplication in simple, large signal and small signal models. Even though the assumptions for simple models cannot be perfectly satisfied, the actual implementation of the mixers provides extremely low distortion. In the event of circuit imbalances, the ports at 52 and 54 should be terminated in a low impedance to minimize distortions.

Figure 2:
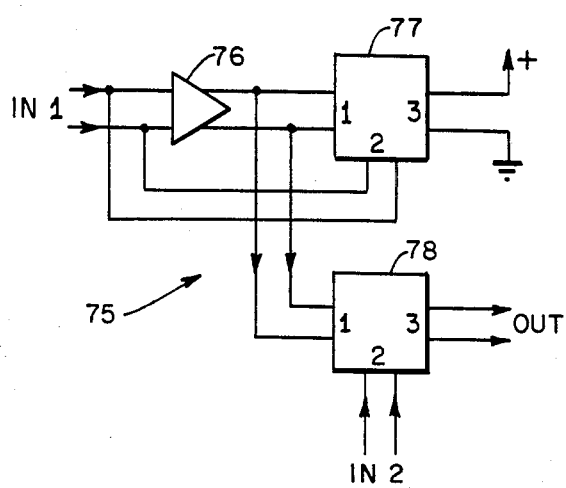
FIG. 2 is a block diagram showing a mixer connected to predistort the signal received by a second mixer.

Since some of the distortions are independent of the signal at the other input a further reduction in circuit distortion is provided by predistorting the signal. One method of signal predistortion is shown in FIG. 2, where the signal to port 1 (56) of the first mixer 77 is first amplified differentially by amplifier 76 before being received by port 1 (56) of the first and a second mixer 77, 78. The second mixer 78 also receives a signal at port 2 (54) and provides an output at port 3 (52). The first mixer 77 provides an output at port 2 to the input of the amplifier 76. Assuming similarities of the first 77 and second 78 mixers, the circuit 75 of FIG. 2 substantially reduces the distortions of the second mixer 78.

Figure 3:
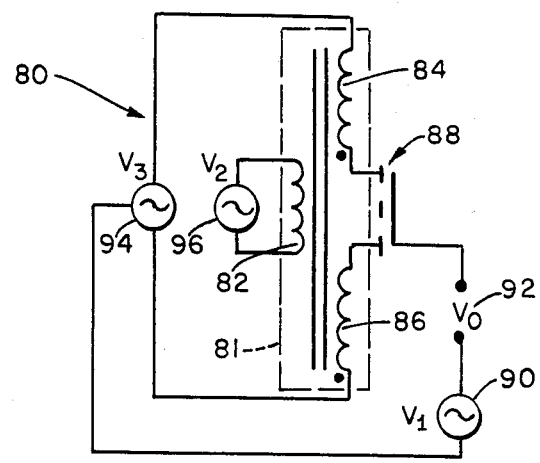
FIG. 3 is a schematic diagram showing one embodiment of a singly balanced mixer according to the present invention.

A singularly-balanced embodiment is shown in the schematic diagram 80 of FIG. 3. A transformer 81, comprises three windings 82, 84 and 86. A variable conductive element, comprising a FET 88 is connected across the end of winding 84 and the beginning of winding 86, and excited by a signal at 90, upon which a bias potential 92 is imposed to provide the conductivity of the FET 88 during the modulated signal at 90. The bias potential 92 is returned to a center tap of a balanced signal source or output at 94, which is in turn connected to the remaining unconnected ends of windings 84 and 86. The third winding 82 is connected to a signal source or output 96. It is appreciated that this embodiment, either signal sources or outputs may appear at 94 or 96, and it is further appreciated that the signal source or output 94 or 96 be provided with low impedance termination for lowest distortion. In this embodiment, the signal provided at 94 or 96 is balanced and therefore does not appear at 90. However, signals provided at either 94 or 96 will appear at the other of the two.

Figure 4:
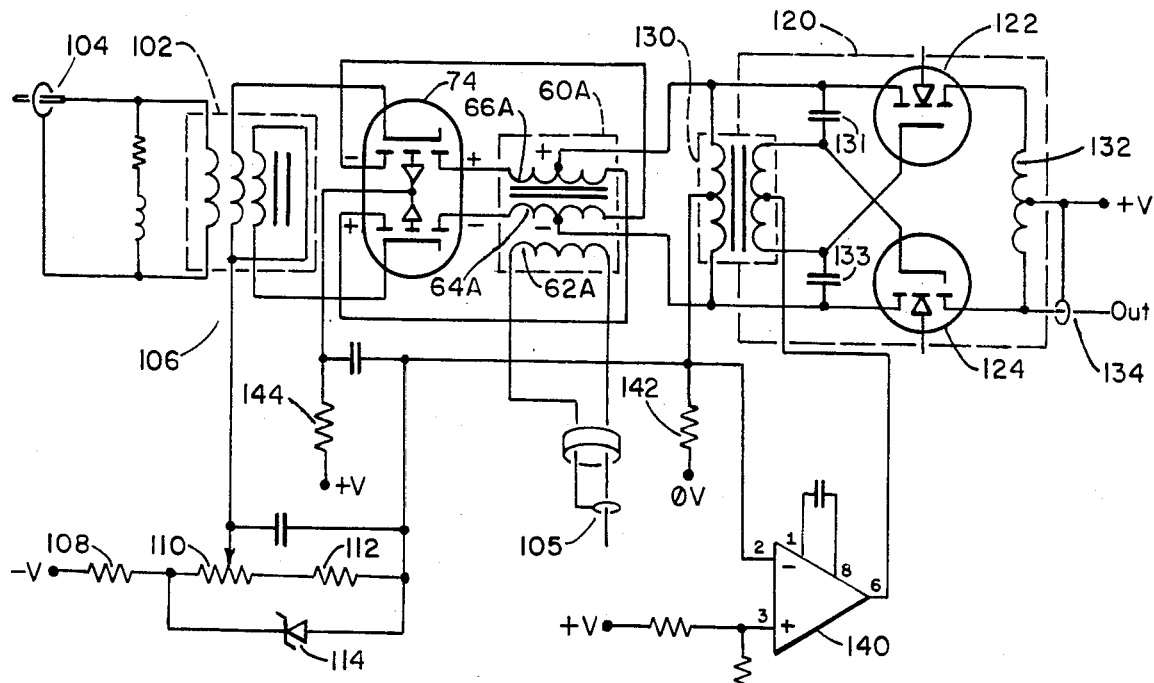
FIG. 4 is a schematic diagram showing the present invention of FIG. 1 applied as a mixer excited by a local oscillator to provide a converted frequency and an IF amplifier.

One application of the present invention is shown in the schematic diagram 100 in FIG. 4, wherein the high performance, doubly-balanced mixer according to FIG. 1 is applied to a mixer application. The mixer transformer 60A comprises the three windings 62A, 64A and 66A, wherein the output signal is developed between the center taps of 64A and 66A. The variable conductance elements comprise a balanced FET pair 74 having a common substrate. The FET pair 74 is driven by a balanced signal provided by input transformer 102, which receives the RF input signal at 104. The $V_0$ bias potential is provided to the input transformer 102 at 106 by a voltage divider comprising potentiometer 110 and resistor 112, Zener diode 114 to stabilize the voltage thereacross, and resistors 108 and 142. The local oscillator signal is received at 105.

Amplifier 120 terminates the port bridging the center taps in a low impedance. The FETs 122 and 124 operate in common-gate mode. Transformer 130 and capacitor 131 and 133 connect both FETs 122 and 124 across the port. The differential AC current (mixer output) is amplified by FETs 122 and 124 and is converted to an unbalanced signal at 134 by center-tapped transformer 132.

The amplifier 140 provides gate bias for the FETs through transformer 130. Resistor 142 sinks the DC current for both FETs 122 and 124.

The resistor 144, connected to the substrate of FET pair 74 back-biases the substrate, and in so doing, reduces the capacitance of FET pair 74.

Furthermore, in view of the low distortion of the mixer according to the present invention, and the independence of the sources of the distortion, output signal levels can be controlled in the mixer with no additional intermodulation (IM) products by varying the local oscillator signal level applied to the mixer by automatic gain control (AGC) signals. This reduces the dynamic range requirements of the following intermediate frequency (IF) amplifiers. As such, the present invention provides high dynamic range with input impedances which do not vary with attenuation of the mixer.

The mixer of the present invention is also operable in a switching mode in which the variable conductance elements are oppositely switched on and off instead of gradually varying the conductance thereof, to provide a mixer of superior performance. Low impedance ports are not needed in this configuration in order to achieve low distortion of ports 52 and 54. The mixer in switching mode is particularly effective as a bi-phase modulator.

Figure 7:
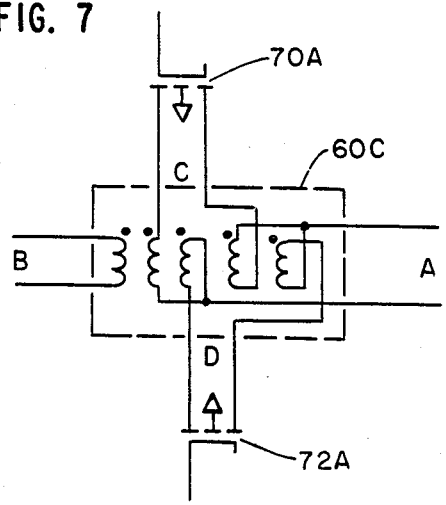
FIG. 7 is a schematic diagram including a third alternate embodiment of the transformer having five windings.

Alternate embodiments of the present invention are envisioned, wherein the mixer of FIG. 1 is used in combination with transformers of alternate embodiments as shown by FIGS. 5-9. The ports 54, 52 and 56 correspond to ports B, A and FET inputs of FIGS. 5-9. The variable resistance element 70A and 72A correspond to the elements 70 and 72 in FIG. 1, and are connected to the transformers of FIGS. 5-9, discussed below. The basic transformer 60, shown in FIG. 1. The transformer 60B of FIG. 6 comprises split windings to which are connected the variable resistance elements 70A and 72A. FIG. 7 provides a five winding version 60D, which typically has one-half of the impedance of the other transformer implementations. Moreover, the transformer windings may be scaled to provide impedance transformation.

Figure 8:
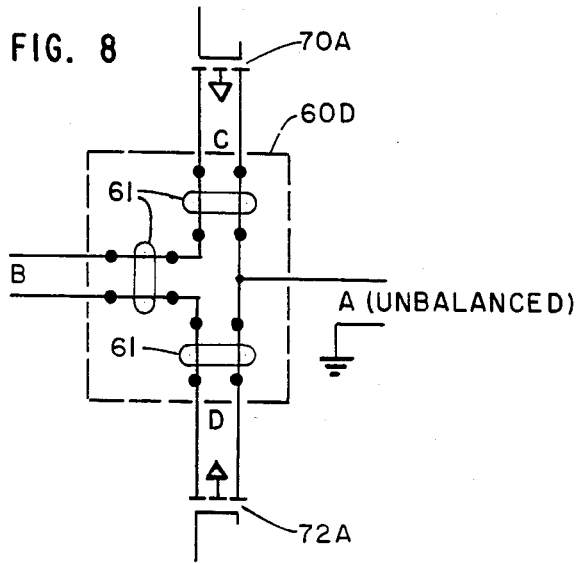
FIG. 8 is a schematic diagram including a fourth alternate transformer embodiment providing an unbalanced A output and comprising transmission line elements.
Figure 9:
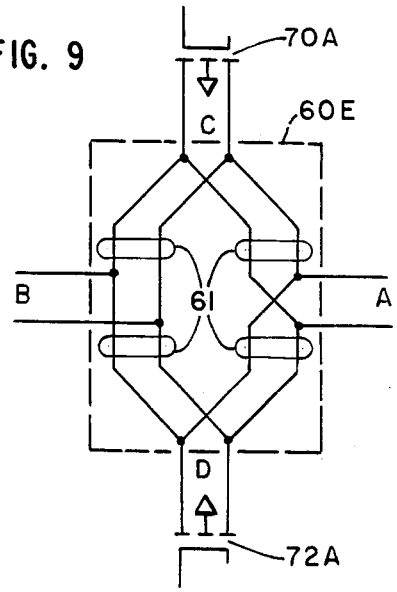
FIG. 9 is a schematic diagram including a fifth alternate embodiment of the transformer comprising transmission line elements.

The present invention is also applicable to higher frequencies, to and including microwave frequencies. The transformer 60C, shown in FIG. 8, provides an unbalanced port at 52A and includes three transmission line sections 61 to provide the desired balanced characteristics of connections B, C and D. The transmission line sections may be optionally surrounded by ferrite cover to extend low frequency response. The transformer 60E of FIG. 9 comprises transmission line paths 61 which may be surrounded by a ferrite core or magnetic material applicable to these frequencies as is known in the art to provide a balanced output at A.

If it is desired to operate a port of the mixer with a low impedance to lower distortion, additional components as shown in FIGS. 10 and 11 can be added to the various embodiments shown. FIGS. 10 and 11 demonstrate the connection of these additional components, with the basic circuit of FIGS. 1 and 5. The capacitors 61A and 61B shown in FIG. 11 will terminate port 52B and the capacitors 61C and 61D, connected as shown in FIG. 11 will terminate port 54B. In these circuits 61A–61D serve to lower the impedance across the selected port at high frequencies. Inductors may be placed in parallel with or series with or replace the capacitors to terminate the port at other frequency ranges.

If a step-up transformer or other matching network is used to couple an input signal into the FET gates, the circuit (similar to FIG. 4) provides positive conversion gain through the mixer when the other (local oscillator) input is driven near its maximum input level as limited by ($V_0$-FET threshold) voltage.

Other changes, embodiments or substitutions made by one skilled in the art according to the present invention is considered within the scope of the present invention which is not to be limited by the claims which follow.

APPENDIX

Accordins to [1], an MOSFET the four-terminal I-V equation $$I_D = Z/L \, u \, C((V_G-V_T-V_D/2)V_D-(V_G-V_T-V_S/2)V_S-k-(|V_D+2F|^{3/2}-|V_S+2F|^{3/2}))$$

Where the voltages are referred to the substrate and
Z = channel width
L = channel length
u = effective inversion layer mobility
C = Gate-oxide capacitance per unit area
F = Fermi potential of the substrate Referins all the voltages to a midpoint between source and drain by substitutions $$V_G => V_C - V_B$$

$$V_D => V_R/2 - V_B$$

$$V_S => -V_R/2 - V_B$$

we set $$I_D = Z/L \, u \, C \, [(V_T-V_C)V_R - k(|V_R/2-V_B+2F|^{3/2} - |-V_R/2-V_B+2F|^{3/2})]$$

If we now parallel 2 MOSFETs but with the states biased on and driven differentially:

$$V_C = V_O +/- V_A$$

we set a common mode I-V relation of $$I_C = 2 Z/L \, u \, C \, [(V_T-V_O)V_R - k(|V_R/2-V_B+2F|^{3/2} - |-V_R/2-V_B+2F|^{3/2})]$$

and a differential mode I-V relation of $$I_D = 2 Z/L \, u \, C \, V_A V_R$$

Therefore, in this simple model we have achieved perfect multiplication. Notice that this model is both the larse signal model and the small signal model; Hence a large dynamic range is available.

[1] Computer-Aided Design and Characterization of distal MOS Interated Circuits, Dov Frohman-Bentchkowsky and Leslie Vasdasz, IEEE Journal of Solid-State Circuits, Vol. SC-4, No. 2, April 1969.

What is claimed is
1. A doubly-balanced mixer comprising:
   a transformer having a first winding, a second winding and a third winding;
   a pair of variable conductance elements, the first being connected to a beginning and an end of the first and second windings of said transformer and the second variable conductance element being connected to the remaining end and beginning of said first and second windings, said variable conductance elements being oppositely excited so as to produce a decrease in conductance in one of said pair while increasing the conductance in the other of said pair;
   first port input means comprising means to oppositely excite said variable conductance pair;
   second port means comprising said third winding of said transformer; and
   third port means comprising center taps on said first and second winding of said transformer.
2. The mixer of claim 1, wherein said pair of variable conductance elements together provides a constant paralleled conductance.
3. The mixer of claim 1, wherein said pair of variable conductance elements are alternately switched on and off.
4. The mixer according to claim 1, wherein said pair of variable conductance elements comprise a pair of field effect transistors.
5. The mixer according to claim 1, further including a bias source connected between said first port and said third port for selectively providing a bias potential for said field effect transistors.
6. The mixer according to claim 5, wherein at least one of said first port and said third port further includes:
   means for providing a balanced RF signal, further including a bias means having a center tap thereon for connection to a bias source.
7. The mixer according to claim 1, further including predistortion means providing a predistorted signal to at least one of said first, second and third ports.
8. The mixer according to claim 7, wherein said predistortion means includes a second doubly-balanced mixer.

9. The doubly-balanced mixer of claim 1, wherein at least one of said first, second and third windings comprises a split winding.

10. The doubly-balanced mixer of claim 1, further including
reactive means connected from one of said variable conductance elements to the other of said variable conductance elements to provide low impedance termination of a selected one of said second and third ports.

11. A singularly-balanced mixer comprising:
a transformer having a first, a second and a third winding;
a variable conductance element connected to an end of said first and the beginning of said second winding, each said first and second windings having an end unconnected to said variable conductance element;
first port means comprising means to control the conductance of said variable conductance element;
second port means comprising said third winding of said transformer; and
third port means comprising the unconnected ends of said first and second winding.

12. The mixer according to claim 11 wherein said variable conductance element comprises a field effect transistor.

13. The mixer according to claim 12 further including means for applying a bias signal to said field effect transistor through said first and said third port.

14. A doubly-balanced mixer comprising:
a transformer having a first winding, a second winding and a third winding wherein said first and second windings comprise split windings each having isolated first and second portions;
a pair of variable conductance elements, the first being connected to a beginning and an end of different portions of the first winding of said transformer and the second variable conductance element being connected to a beginning and end of different portions of said second winding, said variable conductance elements being oppositely excited so as to produce a decrease in conductance in one of said pair while increasing the conductance in the other of said pair;
first port input means comprising means to oppositely excite said variable conductance pair;
second port means comprising said third winding of said transformer; and
third port means having two terminals, the first terminal being connected to an unconnected end of one portion of said first winding and to an unconnected end of one portion of said second winding of said transformer, the second terminal being connected to an unconnected end of the other portion of said first winding and to an unconnected end of the other portion of said second winding.

* * * * *

UNITED STATES PATENT AND TRADEMARK OFFICE
CERTIFICATE OF CORRECTION

PATENT NO. : 4,727,596

DATED : Feb. 23, 1988

INVENTOR(S) : Aubrey Jaffer

It is certified that error appears in the above-identified patent and that said Letters Patent is hereby corrected as shown below:

```
Column 3, line 45, "input a" should read --input, a--.

Figure 5:
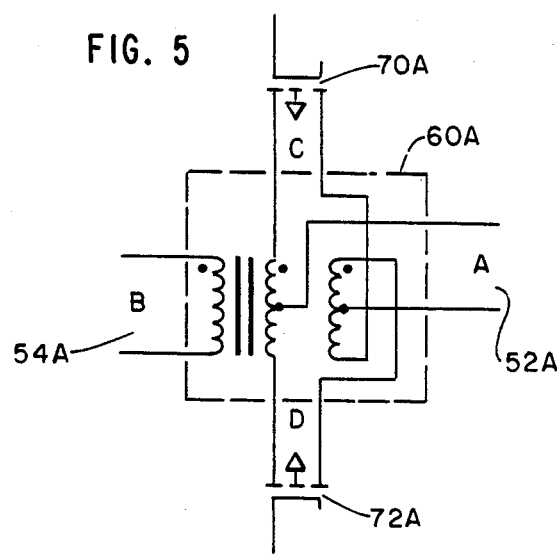
FIG. 5 is a schematic diagram including an embodiment of the transformer.
Figure 6:
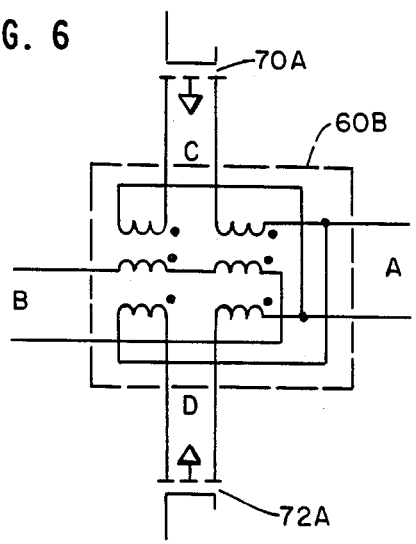
FIG. 6 is a schematic diagram including a second alternate embodiment of the transformer.

Column 4, line 67, "FIG. 1." should read --FIG. 5, corresponds to
                    the transformer 60 in FIG. 1.--.

Column 5, line 45, "Accordins" should read --According--.

Column 5, line 53, "voltases" should read --voltages--.

Column 5, line 60, "substitutions" should read --substituting--.

--

Column 5, line 68, "we set" should read --we get--.

Column 6, line 5,  "the states" should read --the gates--.

Column 6, line 10, "we set" should read --we get--.
```

UNITED STATES PATENT AND TRADEMARK OFFICE
CERTIFICATE OF CORRECTION

PATENT NO. : 4,727,596
DATED : Feb. 23, 1988
INVENTOR(S) : Aubrey Jaffer

It is certified that error appears in the above-identified patent and that said Letters Patent is hereby corrected as shown below:

Column 6, line 20, "larse signal" should read --large signal--.

Column 6, line 22, "distal MOS" should read --digital MOS--.

Column 6, line 54, "claim 1," should read --claim 4,--.

Signed and Sealed this

First Day of August, 1989

Attest:

DONALD J. QUIGG

Attesting Officer

Commissioner of Patents and Trademarks